(12) United States Patent
Sonehara (10) Patent No.: US 10,312,251 B2
(45) Date of Patent: Jun. 4, 2019

(54) SEMICONDUCTOR MEMORY DEVICE AND METHOD FOR MANUFACTURING SAME

(71) Applicant: Toshiba Memory Corporation, Minato-ku (JP)

(72) Inventor: Takeshi Sonehara, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/461,598

(22) Filed: Mar. 17, 2017

(65) Prior Publication Data

US 2018/0226422 A1 Aug. 9, 2018

Related U.S. Application Data

(60) Provisional application No. 62/455,633, filed on Feb. 7, 2017.

(51) Int. Cl.
| | |
|---|---|
| *H01L 27/11556* | (2017.01) |
| *H01L 27/11519* | (2017.01) |
| *H01L 27/11524* | (2017.01) |
| *H01L 27/11565* | (2017.01) |
| *H01L 27/1157* | (2017.01) |
| *H01L 27/11582* | (2017.01) |

(52) U.S. Cl.
CPC .... *H01L 27/11556* (2013.01); *H01L 27/1157* (2013.01); *H01L 27/11519* (2013.01); *H01L 27/11524* (2013.01); *H01L 27/11565* (2013.01); *H01L 27/11582* (2013.01)

(58) Field of Classification Search
CPC .......... H01L 27/11556; H01L 29/1037; H01L 27/1157; H01L 27/11582; H01L 27/11524; H01L 27/11565; H01L 29/42368; H01L 27/11519
See application file for complete search history.

(56) References Cited

U.S. PATENT DOCUMENTS

| | | | |
|---|---|---|---|
| 2007/0252201 A1 | 11/2007 | Kito et al. | |
| 2009/0242966 A1 | 10/2009 | Son et al. | |
| 2011/0303971 A1 | 12/2011 | Lee et al. | |
| 2013/0107602 A1 | 5/2013 | Oh et al. | |
| 2013/0134492 A1* | 5/2013 | Yang | H01L 27/1157 |
| | | | 257/314 |

FOREIGN PATENT DOCUMENTS

JP 2013-93577 5/2013

* cited by examiner

*Primary Examiner* — David Vu
(74) *Attorney, Agent, or Firm* — Oblon, McClelland, Maier & Neustadt, L.L.P.

(57) ABSTRACT

A semiconductor memory device according to an embodiment includes a stacked body in which an electrode film and an insulating film are alternately stacked along a first direction, a semiconductor member extending in the first direction and piercing the stacked body, and a charge storage member provided between the semiconductor member and the electrode film. The electrode film includes a first portion. The first portion is composed of a metal silicide. The first portion surrounds the semiconductor member as viewed from the first direction.

12 Claims, 12 Drawing Sheets

FIG. 13

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/455,633, filed on Feb. 7, 2017; the entire contents of which are incorporated herein by reference.

FIELD

Embodiments relate to a semiconductor memory device and a method for manufacturing the same.

BACKGROUND

Recently, a stacked-type semiconductor memory device in which memory cells are three-dimensionally integrated has been proposed. In such a stacked-type semiconductor memory device, a stacked body in which electrode films and insulating films are alternately stacked on a semiconductor substrate is provided, and a semiconductor pillar piercing the stacked body is provided. Then, a memory cell is formed at each of crossing portions between the electrode films and the semiconductor pillar. For such a semiconductor memory device, an object is to increase the operating speed.

DETAILED DESCRIPTION

A semiconductor memory device according to an embodiment includes a stacked body in which an electrode film and an insulating film are alternately stacked along a first direction, a semiconductor member extending in the first direction and piercing the stacked body, and a charge storage member provided between the semiconductor member and the electrode film. The electrode film includes a first portion. The first portion is composed of a metal silicide. The first portion surrounds the semiconductor member as viewed from the first direction.

First Embodiment

First, a first embodiment will be described.

Figure 1:
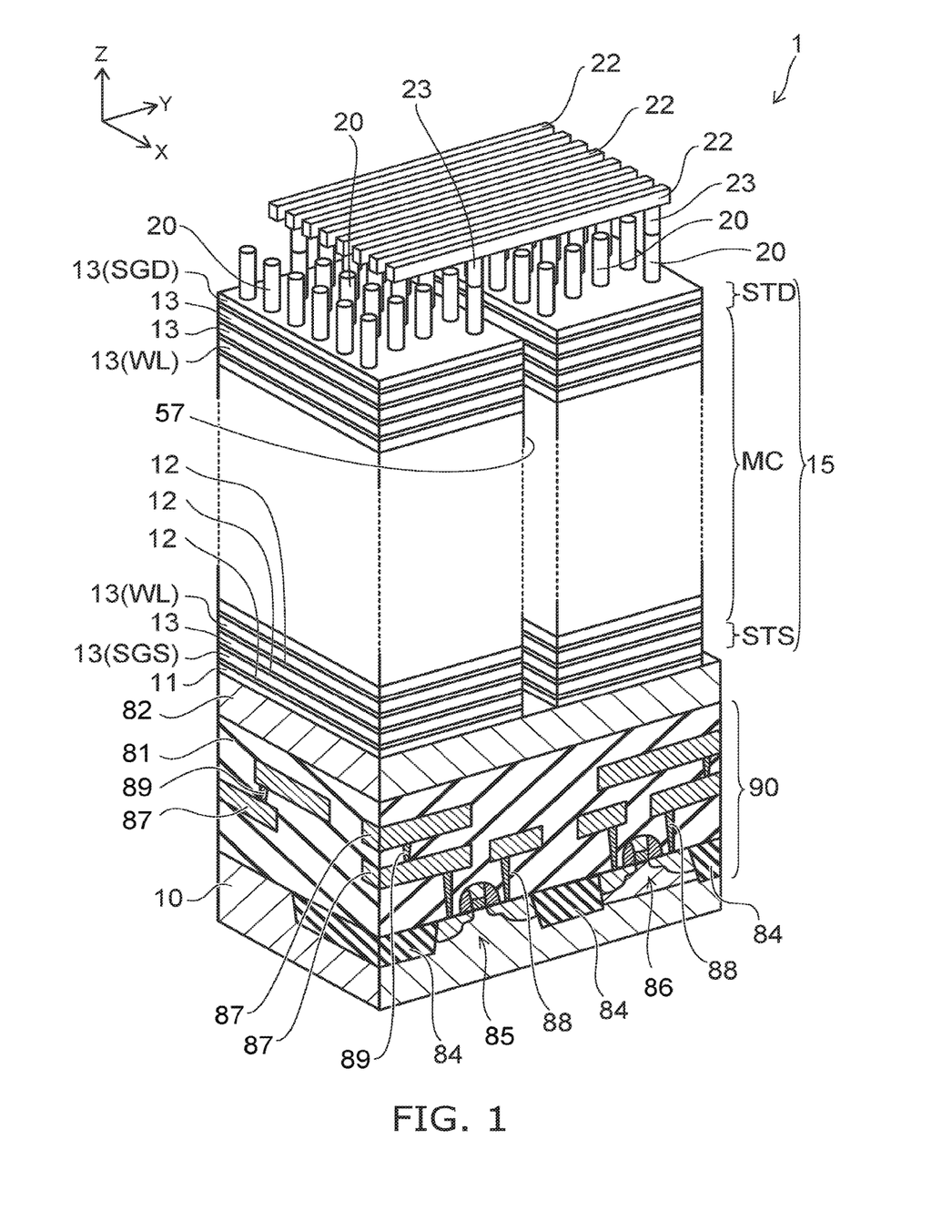
FIG. 1 is a perspective view showing a semiconductor memory device according to a first embodiment.

FIG. 1 is a perspective view showing a semiconductor memory device according to the embodiment.

Figure 2:
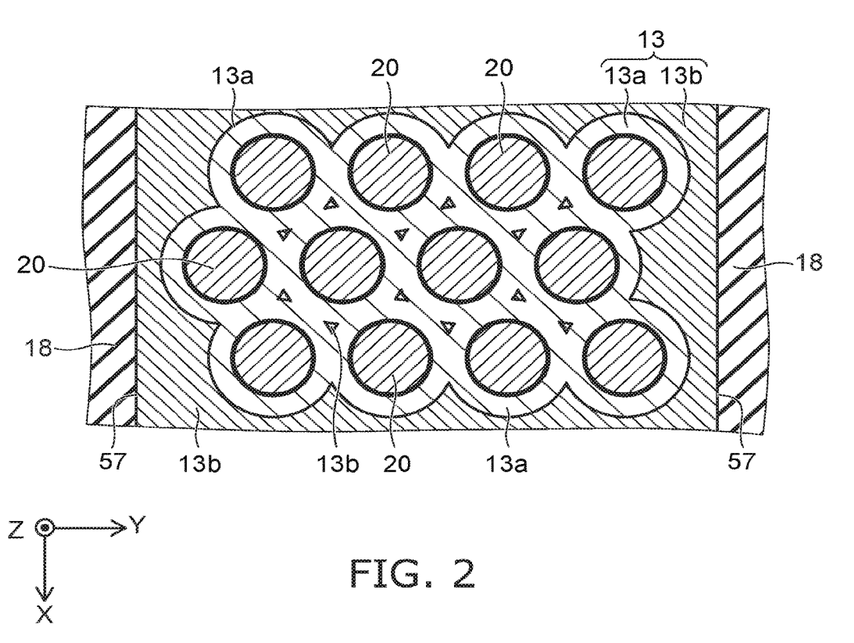
FIG. 2 is a sectional view showing the semiconductor memory device according to the first embodiment.

FIG. 2 is a sectional view showing the semiconductor memory device according to the embodiment.

Figure 3A:
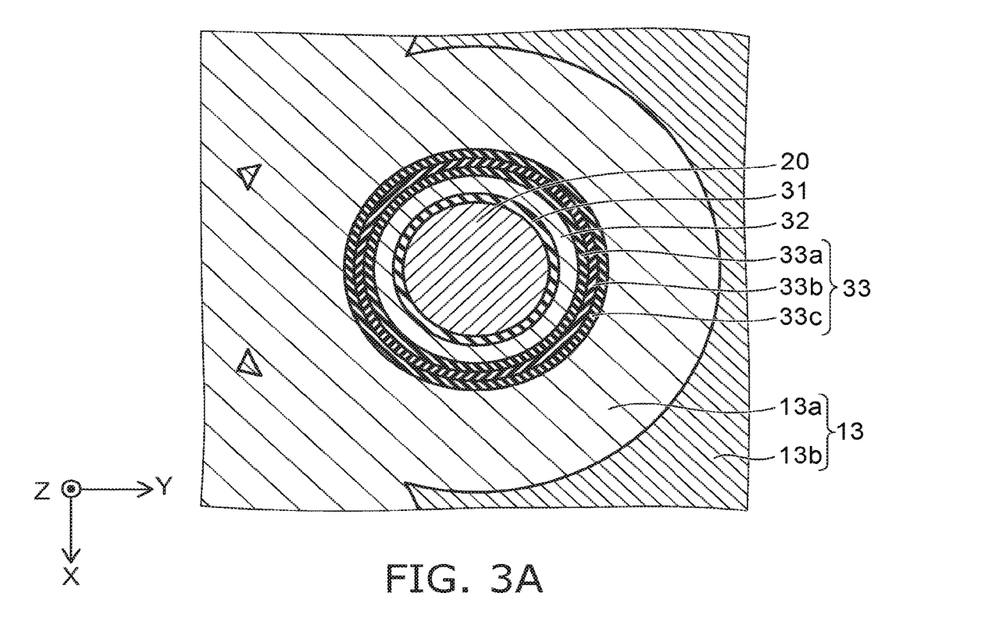
FIG. 3A and FIG. 3B are sectional views showing the semiconductor memory device according to the first embodiment.
Figure 3B:
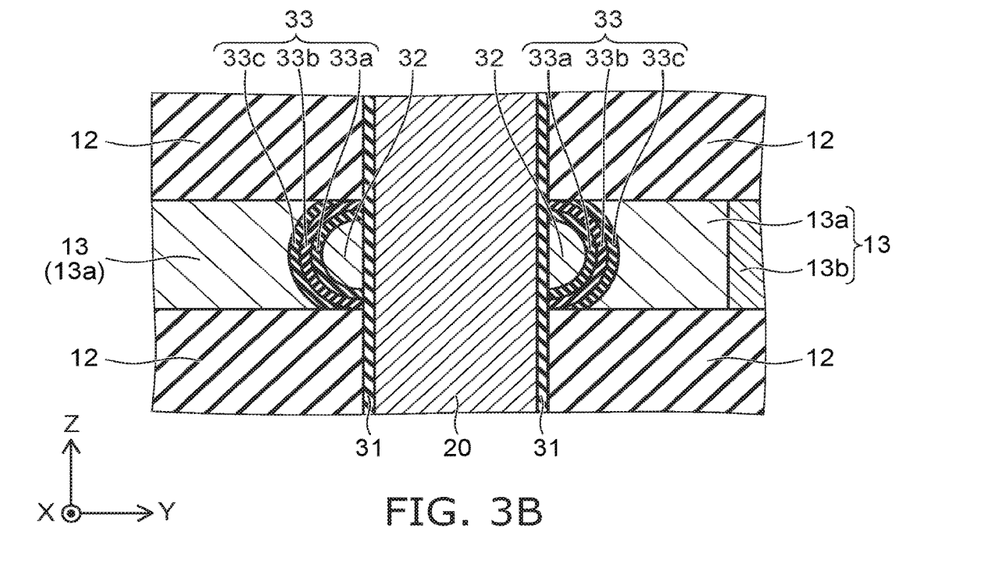

FIG. 3A and FIG. 3B are sectional views showing the semiconductor memory device according to the embodiment.

Incidentally, the respective drawings are schematic views and are drawn in exaggeration and in simplified form as appropriate. For example, each constituent element is drawn such that the number of elements is less than the actual number and the size thereof is larger than the actual size. Further, the number of constituent elements, the dimensional ratios, etc. are not necessarily the same among the drawings.

The semiconductor memory device according to the embodiment is a stacked-type NAND flash memory.

As shown in FIG. 1, in a semiconductor memory device 1 according to the embodiment, a silicon substrate 10 is provided. The silicon substrate 10 is formed of, for example, a single crystal of silicon. On the silicon substrate 10, an interlayer insulating film 81 is provided. The interlayer insulating film 81 is formed of, for example, silicon oxide. On the interlayer insulating film 81, a source electrode film 82 is provided. The source electrode film 82 is formed of, for example, polysilicon doped with an impurity.

Hereinafter, in the specification, for the sake of convenience of description, an XYZ orthogonal coordinate system is adopted. Two directions parallel to an upper surface 10a of the silicon substrate 10 and also orthogonal to each other are referred to as "X-direction" and "Y-direction", and a direction perpendicular to the upper surface 10a of the silicon substrate 10 is referred to as "Z-direction". Further, in the Z-direction, a direction from the silicon substrate 10 to the source electrode film 82 is also referred to as "upper", and a direction opposite thereto is also referred to as "lower". However, these terms are for reference only, and are irrelevant to the direction of gravity.

Further, in the specification, the "silicon substrate" refers to a substrate containing silicon (Si) as a main component. The same shall also apply to other constituent elements, and in a case where a name of a constituent element includes a name of a material, a main component of the constituent element is the material. Further, silicon is generally a semiconductor material, and therefore, unless otherwise stated, a silicon substrate is a semiconductor substrate. The same shall also apply to other constituent elements, and a characteristic of the constituent element reflects a characteristic of the main component unless otherwise stated.

In an upper layer portion of the silicon substrate 10 and in the interlayer insulating film 81, a subcell circuit 90 is formed. The subcell circuit 90 is a part of a driving circuit which performs writing, reading, and erasing of data with respect to the below-mentioned memory cell transistor MC, and includes, for example, a sense amplifier. For example, an upper layer portion of the silicon substrate 10 is partitioned into a plurality of active areas by an STI (Shallow Trench Isolation) 84, and in a certain active area, an n-type MOSFET (Metal-Oxide-Semiconductor Field-Effect Transistor) 85 is formed, and in another active area, a p-type MOSFET 86 is formed.

Further, in the interlayer insulating film 81, an interconnect 87 is provided in a multi-stage, and also a contact 88 which connects the interconnect 87 to the silicon substrate 10, and a via 89 which connects the interconnects 87 are provided. Incidentally, the illustration of the n-type MOSFET 85, the p-type MOSFET 86, the interconnect 87, and the like in FIG. 1 is schematic, and the sizes and arrangements thereof do not necessarily coincide with the actual ones.

A silicon oxide film 11 is provided on the source electrode film 82. A silicon oxide film 12 and an electrode film 13 are alternately stacked in the Z-direction on the silicon oxide film 11. The silicon oxide film 11, and a plurality of silicon oxide films 12 and a plurality of electrode films 13 stacked alternately form a stacked body 15. In the stacked body 15, a slit 57 extending in the X-direction is formed. By the slit 57, the stacked body 15 is divided in the Y-direction. In the stacked body 15 divided by the slit 57, each electrode film 13 extends in the X-direction. That is, a length in the X-direction of the electrode film 13 is longer than a length in the Z-direction of the electrode film 13 and a length in the Y-direction of the electrode film 13. In the slit 57, a silicon oxide plate 18 is provided.

In the stacked body 15, a silicon pillar 20 which extends in the Z-direction and pierces the stacked body 15 is provided. The silicon pillar 20 is composed of polysilicon and has a substantially circular columnar shape. A lower end of the silicon pillar 20 is connected to the silicon substrate 10, and an upper end thereof is exposed on an upper surface of the stacked body 15. The silicon pillars 20 are arranged periodically along a plurality of rows, for example, four rows when viewed from the Z-direction.

A plurality of bit lines 22 extending in the X-direction is provided on the stacked body 15. The bit line 22 is connected to an upper end of the silicon pillar 20 through a plug 23. Therefore, the silicon pillar 20 is connected between the bit line 22 and the silicon substrate 10.

In the stacked body 15, a first stage or a plurality of stages of the electrode film 13 from the upper side functions as an upper selection gate line SGD, and at each of crossing portions between the upper selection gate line SGD and the silicon pillar 20, an upper selection gate transistor STD is formed. Further, a first stage or a plurality of stages of the electrode film 13 from the lower side functions as a lower selection gate line SGS, and at each of crossing portions between the lower selection gate line SGS and the silicon pillar 20, a lower selection gate transistor STS is formed. The electrode films 13 other than the lower selection gate line SGS and the upper selection gate line SGD function as word lines WL, and at each of crossing portions between the word lines WL and the silicon pillar 20, a memory cell transistor MC is formed. According to this, along each silicon pillar 20, a plurality of memory cell transistors MC is connected in series, and to both ends thereof, the lower selection gate transistor STS and the upper selection gate transistor STD are connected, whereby an NAND string is formed.

As shown in FIG. 2, the electrode film 13 is constituted by a silicide portion 13a and a polysilicon portion 13b. The silicide portion 13a is composed of a metal silicide and is disposed around the silicon pillar 20. That is, when viewed from the Z-direction, the silicide portion 13a surrounds the silicon pillar 20. The silicide portions 13a disposed around the adjacent silicon pillars 20 are mutually connected and integrated. In this case, when viewed from the Z-direction, the integrated silicide portion 13a surrounds a plurality of silicon pillars 20. As a result, in the electrode film 13, a path P (see FIG. 10) which is composed of the silicide portion 13a and extends in the X-direction is formed.

The metal silicide forming the silicide portion 13a is, for example, titanium silicide ($TiSi_2$), nickel silicide ($NiSi_2$), cobalt silicide ($CoSi_2$), tungsten silicide ($WSi_2$), platinum silicide ($PtSi_2$), or the like. More generally, when a metal element is represented by M, the metal silicide is represented by a chemical formula: $M_xSi_y$, and the ratio of (x:y) can be set to, for example, (1:2), (1:1), (2:1), or the like. Further, the metal silicide may be a mixed silicide such as NiPtSi.

The polysilicon portion 13b is composed of polysilicon, and is disposed in a position at a fixed distance or more from all the silicon pillars 20 in the electrode film 13, and is mainly disposed in both end portions in the Y-direction of the electrode film 13, that is, in a portion in contact with the silicon oxide plate 18. In the entire electrode film 13, the polysilicon portion 13b surrounds the silicide portion 13a. For example, the polysilicon portion 13b of the electrode film 13 constituting the lower selection gate line SGS and the upper selection gate line SGD contains an impurity to serve as an acceptor such as boron (B), and a conductivity type thereof is p-type. On the other hand, the polysilicon portion 13b of the electrode film 13 constituting the word line WL contains an impurity to serve as a donor such as phosphorus (P), and a conductivity type thereof is n-type. The polysilicon portion 13b may contain at least one of germanium or carbon, in addition to silicon, or instead of silicon.

As shown in FIG. 3A and FIG. 3B, between the silicon pillar 20 and the electrode film 13, a tunneling insulating film 31, a floating gate electrode 32, and a block insulating film 33 are provided in this order from the silicon pillar 20 to the electrode film 13. Incidentally, in FIG. 1 and FIG. 2, the tunneling insulating film 31, the floating gate electrode 32, and the block insulating film 33 are omitted.

The tunneling insulating film 31 is a film which usually has an insulating property, however, when a given voltage within a range of a driving voltage of the semiconductor memory device 1 is applied thereto, it allows a tunneling current to flow therethrough. The tunneling insulating film 31 is formed of, for example, a single layer of a silicon oxide film, or an ONO film in which a silicon oxide layer, a silicon nitride layer, and a silicon oxide layer are stacked in this order.

The floating gate electrode 32 is a conductive body having an ability to store a charge, and is formed of, for example, silicon. The block insulating film 33 is a film which does not substantially allow a current to flow therethrough even if a voltage within a range of a driving voltage of the semiconductor memory device 1 is applied thereto.

The block insulating film 33 is, for example, an ONO film in which a silicon oxide layer 33a, a silicon nitride layer 33b, and a silicon oxide layer 33c are stacked in this order. The silicon oxide layer 33a is in contact with the floating gate electrode 32, and the silicon oxide layer 33c is in contact with the silicide portion 13a of the electrode film 13.

The tunneling insulating film 31 is disposed on the substantially entire side surface of the silicon pillar 20, and has a circular cylindrical shape. The floating gate electrode 32 and the block insulating film 33 are partitioned for each electrode film 13, and each floating gate electrode 32 and each block insulating film 33 have an annular shape surrounding the silicon pillar 20 and the tunneling insulating film 31. Further, the block insulating film 33 is disposed also on an upper surface and a lower surface of the floating gate electrode 32. The floating gate electrodes 32 arranged along the Z-direction are spaced from each other through the silicon oxide film 12, and also the block insulating films 33 arranged along the Z-direction are spaced from each other through the silicon oxide film 12.

Next, a method for manufacturing the semiconductor memory device according to the embodiment will be described.

FIG. 4 to FIG. 9 are sectional views showing the method for manufacturing the semiconductor memory device according to the embodiment.

First, as shown in FIG. 1, an interlayer insulating film 81 is formed on a silicon substrate 10, and also a subcell circuit 90 is formed in an upper layer portion of the silicon substrate 10 and in the interlayer insulating film 81. Subsequently, on the interlayer insulating film 81, a source electrode film 82 is formed. Subsequently, on the source electrode film 82, a silicon oxide film 11 is formed.

Figure 4:
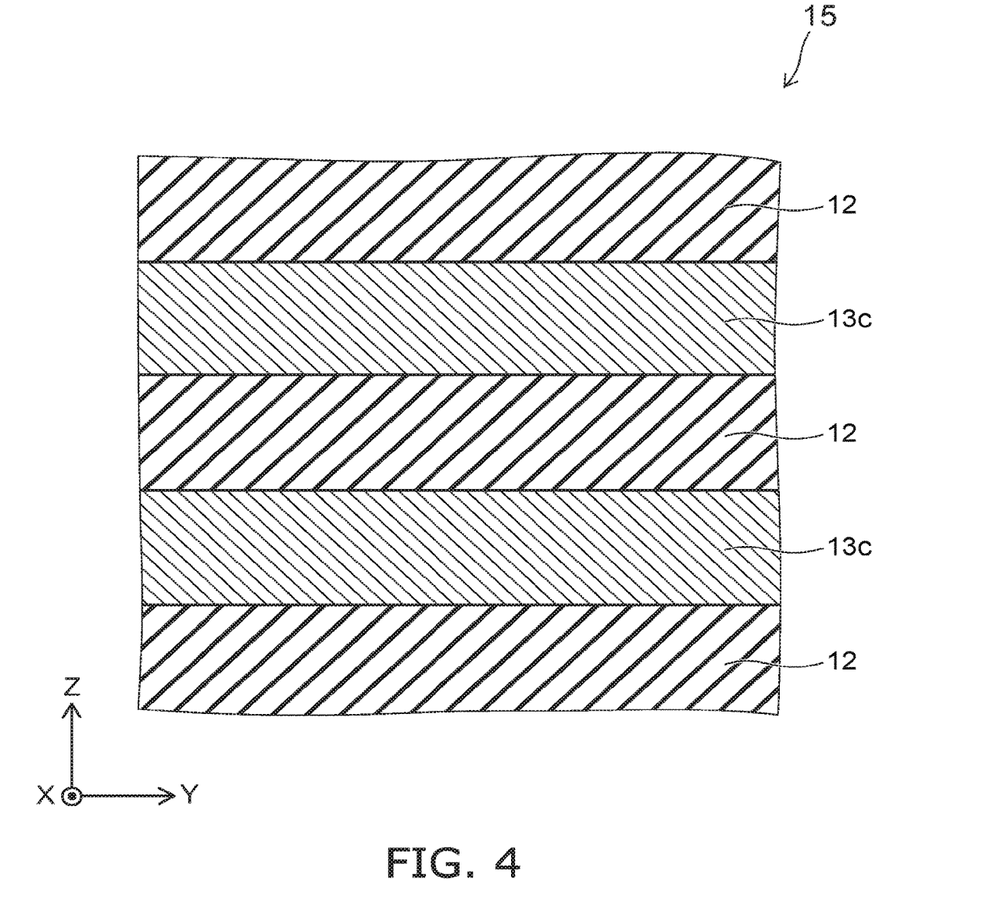
FIG. 4 to FIG. 9 are sectional views showing a method for manufacturing the semiconductor memory device according to the first embodiment.

Subsequently, as shown in FIG. 4, a silicon oxide film 12 and a polysilicon film 13c are alternately formed. At this time, a silicon oxide film 12 is formed in an uppermost stage. By the silicon oxide film 11 (see FIG. 1), a plurality of silicon oxide films 12, and a plurality of polysilicon films 13c, a stacked body 15 is formed.

Figure 5:
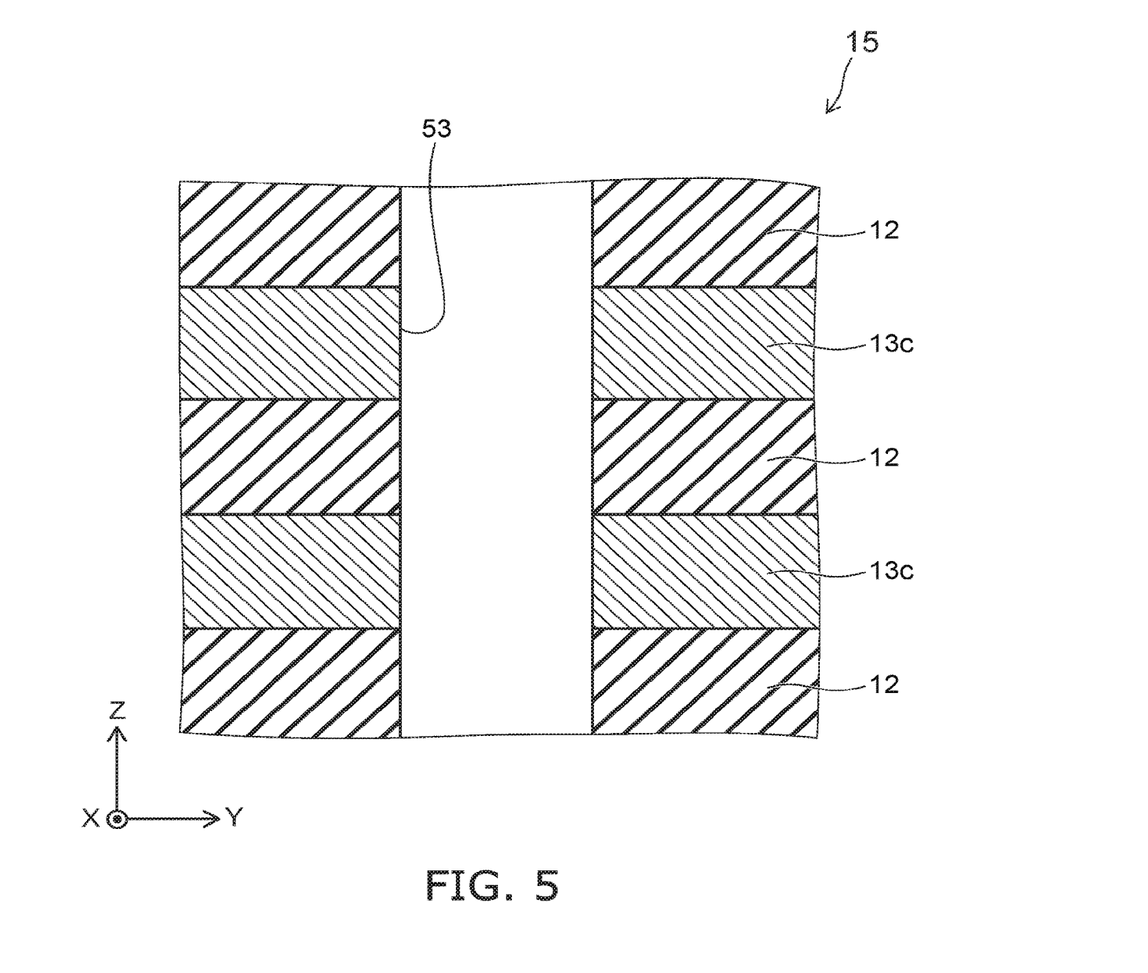

Subsequently, as shown in FIG. 5, a memory hole 53 in a circular columnar shape is formed in the stacked body 15 by, for example, a lithography method and an RIE (Reactive Ion Etching) method. The memory hole 53 is made to reach the source electrode film 82.

Figure 6:
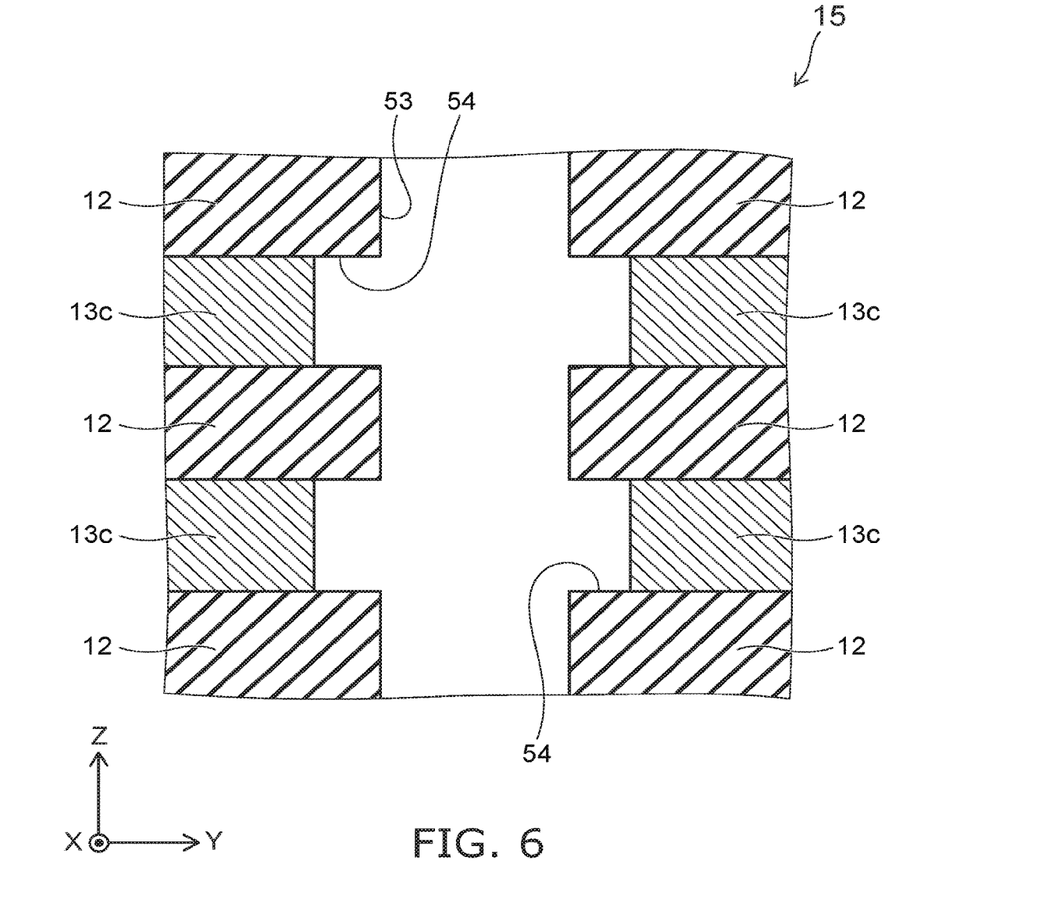

Subsequently, as shown in FIG. 6, the polysilicon film 13c is recessed through the memory hole 53. By doing this, a concave portion 54 is formed on an inner surface of the memory hole 53. The concave portion 54 is formed in an annular shape surrounding the memory hole 53.

Figure 7:
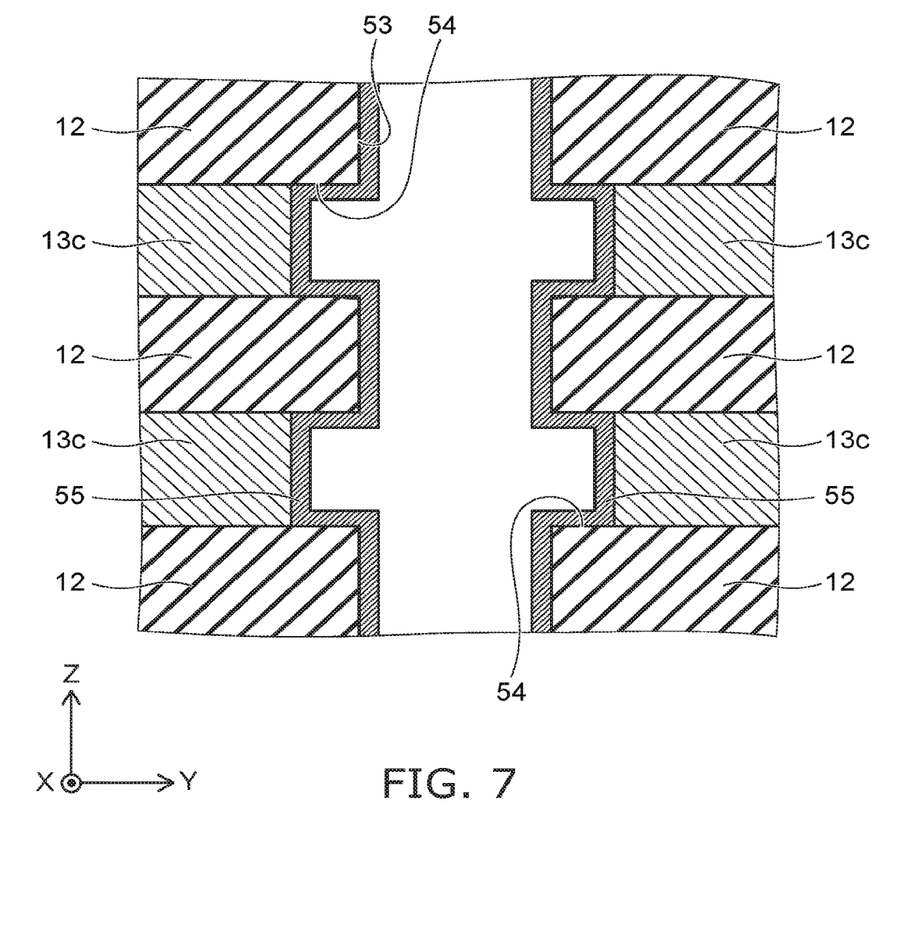

Subsequently, as shown in FIG. 7, by depositing a metal material, a metal film 55 is formed on inner surfaces of the memory hole 53 and the concave portion 54. The metal film contains one or more metals selected from the group consisting of nickel (Ni), cobalt (Co), tungsten (W), and platinum (Pt), and is composed of, for example, nickel.

Figure 8:
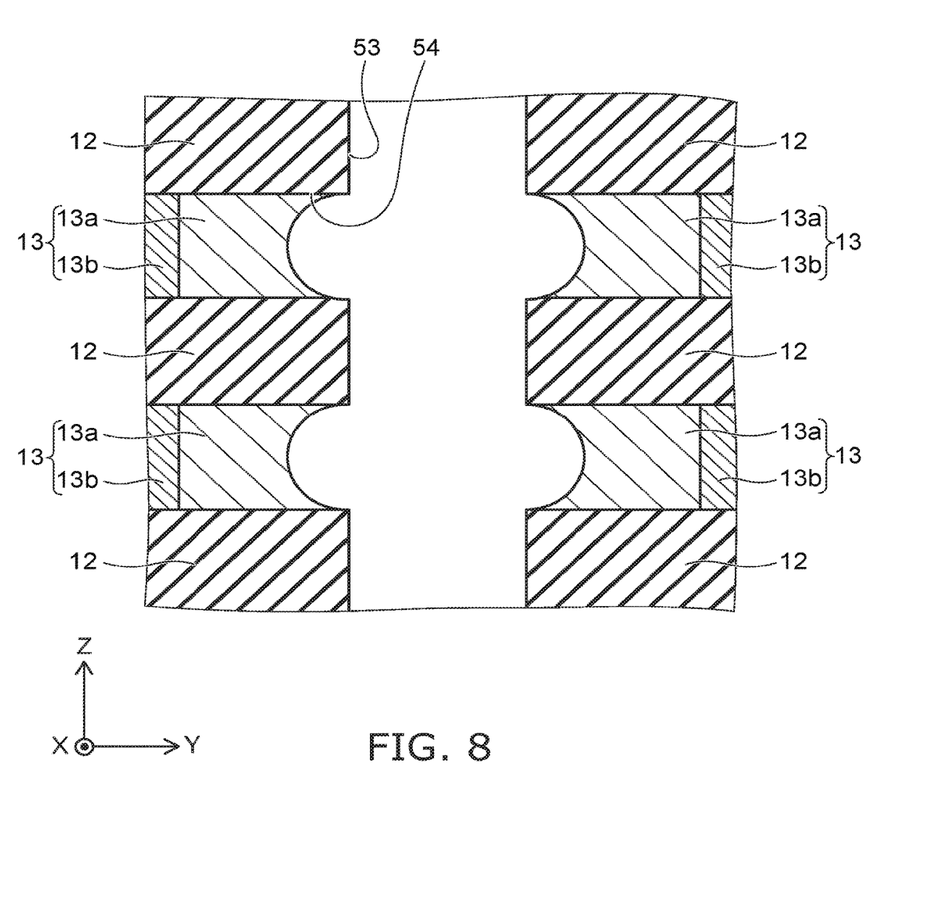

Subsequently, as shown in FIG. 8, by performing a heat treatment, the metal element in the metal film 55 and silicon in the polysilicon film 13c are reacted with each other. By doing this, a metal silicide, for example, nickel silicide is formed, whereby a part of the polysilicon film 13c is converted to a silicide portion 13a. Hereinafter, an unreacted portion of the polysilicon film 13c is referred to as a polysilicon portion 13b. Subsequently, an unreacted portion in the metal film 55 is removed.

Figure 10:
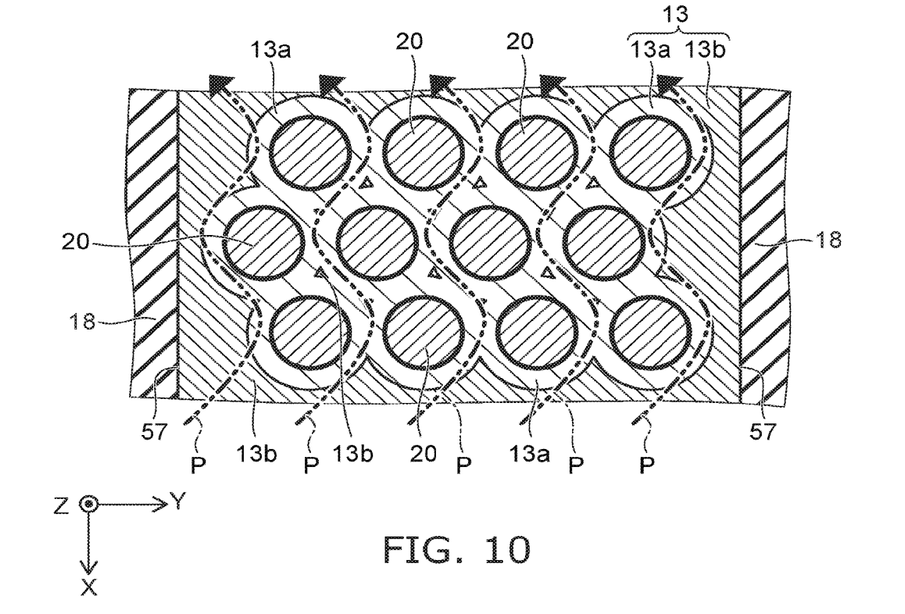
FIG. 10 is a plan view showing an effect of the first embodiment.

At this time, as shown in FIG. 10, the silicide portions 13a formed using the adjacent memory holes 53 as starting points are in contact with each other, and a path P which is formed of the silicide portions 13a and extends in the X-direction is formed in the electrode film 13. On the other hand, the polysilicon portion 13b is left in portions spaced at a fixed distance or more from all the memory holes 53 in the electrode film 13, for example, both end portions in the Y-direction and both end portions in the X-direction of the electrode film 13.

Figure 9:
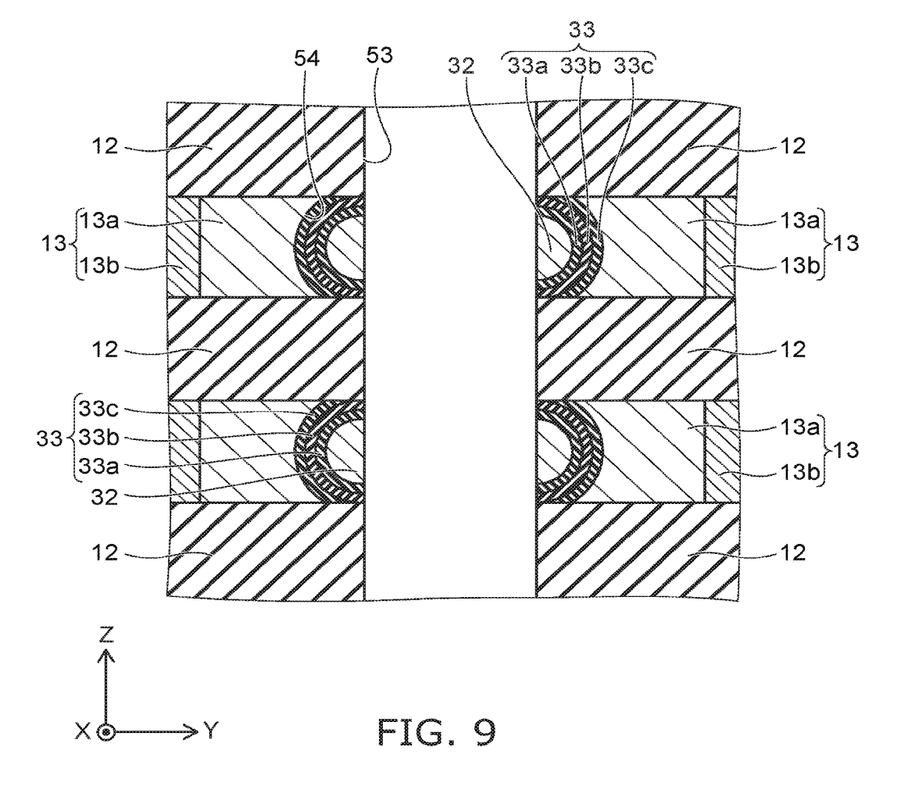

Subsequently, as shown in FIG. 9, by depositing silicon oxide on an entire surface, a silicon oxide layer 33c is formed. The silicon oxide layer 33c is formed also on inner surfaces of the memory hole 53 and the concave portion 54. Subsequently, by depositing silicon nitride on an entire surface, a silicon nitride layer 33b is formed on a surface of the silicon oxide layer 33c. Subsequently, by depositing silicon oxide on an entire surface, a silicon oxide layer 33a is formed on a surface of the silicon nitride layer 33b.

Subsequently, by depositing silicon on an entire surface, a polysilicon film is formed on a surface of the silicon oxide layer 33a. Subsequently, by performing etching such as RIE, a portion deposited in the memory hole 53 in the polysilicon film, the silicon oxide layer 33a, the silicon nitride layer 33b, and the silicon oxide layer 33c is removed, and a portion deposited in the concave portion 54 is left. By doing this, in the concave portion 54, a block insulating film 33 composed of the silicon oxide layer 33c, the silicon nitride layer 33b, and the silicon oxide layer 33a, and a floating gate electrode 32 composed of polysilicon are formed.

Subsequently, as shown in FIG. 3A and FIG. 3B, for example, silicon oxide is deposited on an entire surface. By doing this, on an inner surface of the memory hole 53, a tunneling insulating film 31 is formed. The tunneling insulating film 31 covers the floating gate electrode 32. Subsequently, by depositing silicon, a silicon pillar 20 is formed in the memory hole 53.

Subsequently, as shown in FIG. 1 and FIG. 2, a slit 57 extending in the X-direction is formed in the stacked body 15. The slit 57 is made to reach the source electrode film 82. Subsequently, by burying silicon oxide in the slit 57, a silicon oxide plate 18 is formed.

Subsequently, an insulating film (not shown) is formed on the stacked body 15, and a plug 23 is formed in the insulating film. The plug 23 is connected to the silicon pillar 20. Subsequently, a bit line 22 extending in the X-direction is formed on the insulating film, and is connected to the plug 23. In this manner, the semiconductor memory device 1 according to the embodiment is manufactured.

Next, an effect of the embodiment will be described.

FIG. 10 is a plan view showing an effect of the embodiment.

In the semiconductor memory device 1 according to the embodiment, a part of the electrode film 13, that is, the silicide portion 13a is formed of a metal silicide. According to this, the resistance of the electrode film 13 is reduced, and the operating speed of the semiconductor memory device 1 can be improved.

Further, as shown in FIG. 10, in the semiconductor memory device 1, the silicide portions 13a formed around the adjacent silicon pillars 20 are in contact with each other and form the path P which extends along the X-direction and is composed of the metal silicide. According to this, the resistance along the X-direction of the electrode film 13 can be further reduced.

Further, in the embodiment, in the process shown in FIG. 4, the stacked body 15 is formed by alternately depositing the silicon oxide film 12 and the polysilicon film 13c, and in the process shown in FIG. 5, the memory hole 53 is formed in the stacked body 15. Thereafter, in the process shown in FIG. 7, the metal film 55 is formed, and in the process shown in FIG. 8, the silicide portion 13a is formed. Due to this, the memory hole 53 is more easily formed as compared with a case where a stacked body is formed by stacking a silicon oxide film and a silicide film from the beginning, and a memory hole is formed in this stacked body. Therefore, the semiconductor memory device 1 according to the embodiment is easily manufactured.

Second Embodiment

Next, a second embodiment will be described.

Figure 11:
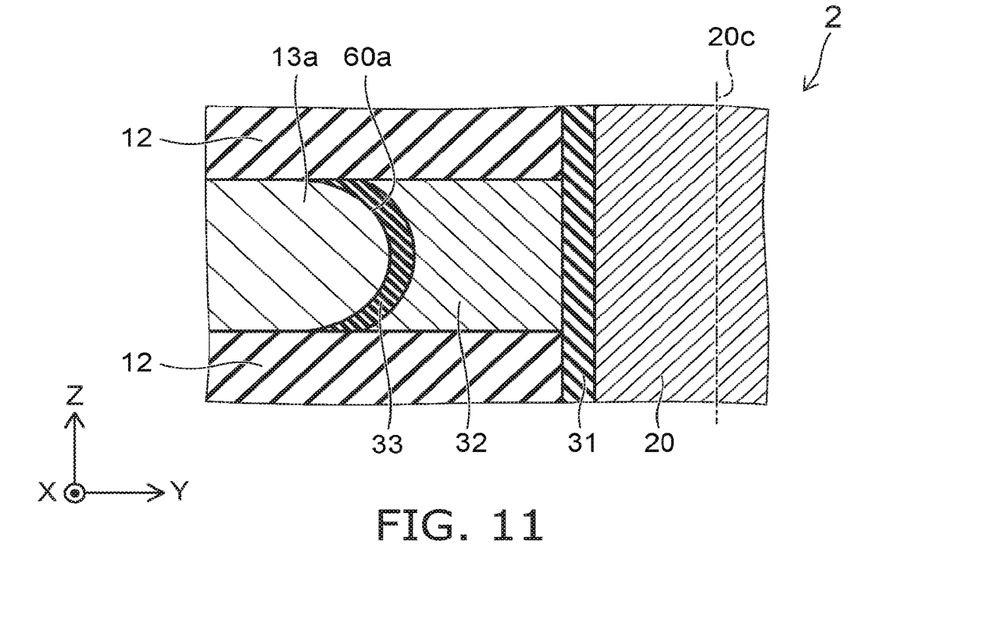
FIG. 11 is a sectional view showing a semiconductor memory device according to a second embodiment.

FIG. 11 is a sectional view showing a semiconductor memory device according to the embodiment.

As shown in FIG. 11, in a semiconductor memory device 2 according to the embodiment, in a cross section including a central axis 20c of a silicon pillar 20, a surface 60a facing the silicon pillar 20 of a silicide portion 13a is curved so as to be convex toward the silicon pillar 20. That is, between silicon oxide films 12 adjacent to each other in the Z-direction, a distance between a central portion in the Z-direction of the surface 60a and the silicon pillar 20 is shorter than a distance between an upper edge of the surface 60a and the silicon pillar 20, and a distance between a lower edge of the surface 60a and the silicon pillar 20. Incidentally, the surface 60a is a boundary surface between the silicide portion 13a and the block insulating film 33.

In the embodiment, in a silicidation treatment shown in FIG. 8, a heat treatment is performed for a sufficiently long time so as to achieve thermal saturation. By doing this, an end portion of the silicide portion 13a is rounded, and the surface 60a curved so as to be convex toward the silicon pillar 20 is formed.

According to the embodiment, since the surface 60a is curved, the area of the surface 60a is larger as compared with a case where the surface 60a is not curved. As a result, a coupling ratio between the electrode film 13 and the floating gate electrode 32 can be improved.

The other configuration, manufacturing method, and effect of the embodiment are the same as those of the above-mentioned first embodiment.

Third Embodiment

Next, a third embodiment will be described.

Figure 12:
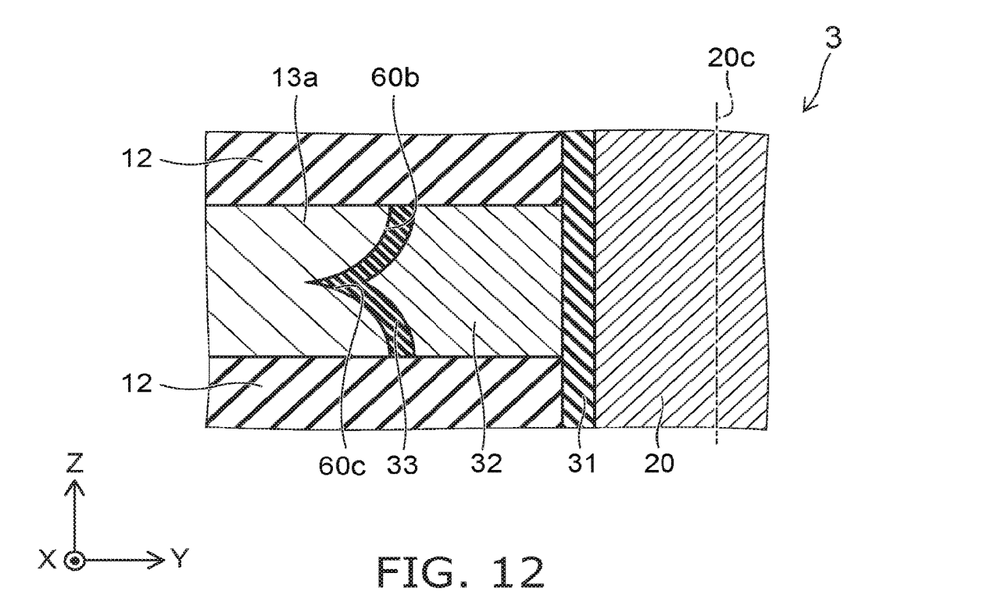
FIG. 12 is a sectional view showing a semiconductor memory device according to a third embodiment.

FIG. 12 is a sectional view showing a semiconductor memory device according to the embodiment.

As shown in FIG. 12, in a semiconductor memory device 3 according to the embodiment, in a cross section including a central axis 20c of a silicon pillar 20, a concave portion 60c is formed on a surface 60b facing the silicon pillar 20 of a silicide portion 13a. According to this, between silicon oxide films 12 adjacent to each other in the Z-direction, a distance between a central portion in the Z-direction of the surface 60b and the silicon pillar 20 is longer than a distance between an upper edge of the surface 60b and the silicon pillar 20, and a distance between a lower edge of the surface 60b and the silicon pillar 20.

In the embodiment, in a silicidation treatment shown in FIG. 8, the conditions for a heat treatment are controlled so that a silicide portion 13a is formed by sucking a metal film 55 deposited on an upper surface and a lower surface of the silicon oxide film 12. By doing this, an upper edge and a lower edge of the surface 60b of the silicide portion 13a project on a side of a memory hole 53, whereby the concave portion 60c is formed in the center in the Z-direction.

Also in the embodiment, in the same manner as in the above-mentioned second embodiment, the area of the surface 60b is large, and therefore, a coupling ratio between the electrode film 13 and the floating gate electrode 32 can be improved.

The other configuration, manufacturing method, and effect of the embodiment are the same as those of the above-mentioned first embodiment.

Fourth Embodiment

Next, a fourth embodiment will be described.

Figure 13:
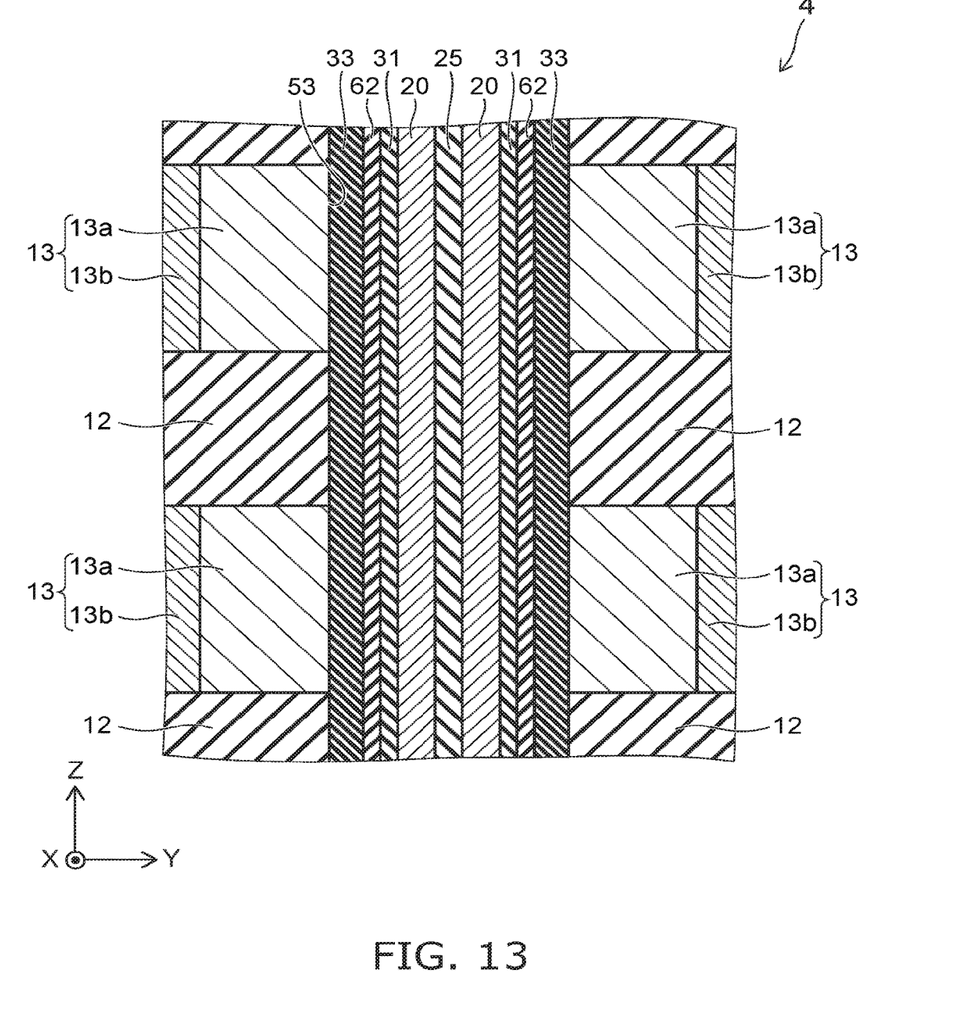
FIG. 13 is a sectional view showing a semiconductor memory device according to a fourth embodiment.

FIG. 13 is a sectional view showing a semiconductor memory device according to the embodiment.

As shown in FIG. 13, in a semiconductor memory device 4 according to the embodiment, as compared with the semiconductor memory device 1 (see FIG. 3) according to the above-mentioned first embodiment, as a charge storage member, a charge storage film 62 is provided in place of the floating gate electrode 32. The charge storage film 62 is formed of an insulating material having an electron trap site, and is composed of, for example, silicon nitride. Further, the charge storage film 62 and the block insulating film 33 are provided on an entire inner surface of a memory hole 53.

Therefore, the charge storage film 62 and the block insulating film 33 have a circular cylindrical shape surrounding a silicon pillar 20. Further, in the silicon pillar 20, a core member 25 extending in the Z-direction is provided. The core member 25 is formed of, for example, an insulating material such as silicon oxide.

The other configuration and effect of the embodiment are the same as those of the above-mentioned first embodiment.

According to the embodiments described above, a semiconductor memory device having a high operating speed and a method for manufacturing the same can be realized.

Incidentally, in the above-mentioned respective embodiments, an example in which the silicide portions 13a surrounding the adjacent silicon pillars 20 are in contact with each other is shown. However, the embodiments are not limited thereto, and the silicide portions 13a surrounding the adjacent silicon pillars 20 may be spaced from each other. Also in this case, the resistance of the electrode film 13 can be reduced as compared with a case where the entire electrode film 13 is formed of polysilicon. Further, the entire electrode film 13 may be formed by a silicide.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
   a stacked body in which an electrode film and an insulating film are alternately stacked along a first direction;
   a semiconductor member extending in the first direction and piercing the stacked body; and
   a charge storage member provided between the semiconductor member and the electrode film,
   the electrode film including a first portion and a second portion, the first portion surrounding the semiconductor member as viewed from the first direction and the second portion surrounding the first portion, the first portion being provided between the semiconductor member and the second portion, the second portion having a first material selected from silicon, germanium, or carbon, the second portion not having a metal silicide, the first portion having a metal silicide including the first material.

2. The device according to claim 1, wherein the second portion contains an impurity to serve as a donor.

3. The device according to claim 1, wherein the second portion contains an impurity to server as an acceptor.

4. The device according to claim 1, wherein
   a length in a second direction crossing the first direction of the electrode film is longer than a length in the first direction of the electrode film and a length in a third direction intersecting a plane including the first direction and the second direction of the electrode film, and
   at least a part of the second portion is disposed in both end portions in the third direction of the electrode film.

5. The device according to claim 1, wherein the first portion surrounds a plurality of the semiconductor members as viewed from the first direction.

6. The device according to claim 1, wherein the metal silicide contains silicon and one or more metals selected from the group consisting of titanium, nickel, cobalt, tungsten, and platinum.

7. The device according to claim 1, wherein in a cross section including a central axis of the semiconductor member, a concave portion is formed on a surface facing the semiconductor member of the first portion.

8. The device according to claim 1, wherein the charge storage member has electrical conductivity, and is divided for each electrode film in the first direction.

9. The device according to claim 1, wherein the charge storage member contains silicon.

10. The device according to claim 1, further comprising:
a first insulating film provided between the first portion and the charge storage member, wherein
the first insulating film includes
a first layer containing silicon oxide,
a second layer containing silicon nitride, and
a third layer containing silicon oxide, and
the second layer is disposed between the first layer and the third layer.

11. The device according to claim 1, further comprising:
a second insulating film containing silicon oxide, and provided between the charge storage member and the semiconductor member.

12. The semiconductor memory device according to claim 1, wherein the first portion forms a path which extends along a second direction so that a resistance along the second direction of the electrode film is reduced, the path having a metal silicide.

* * * * *